United States Patent [19]

Izumi

[11] Patent Number: 5,306,666
[45] Date of Patent: Apr. 26, 1994

[54] PROCESS FOR FORMING A THIN METAL FILM BY CHEMICAL VAPOR DEPOSITION

[75] Inventor: Hirohiko Izumi, Sagamihara, Japan

[73] Assignee: Nippon Steel Corporation, Tokyo, Japan

[21] Appl. No.: 94,226

[22] Filed: Jul. 21, 1993

[30] Foreign Application Priority Data

Jul. 24, 1992 [JP] Japan .................. 4-198778

[51] Int. Cl.$^5$ ..................... H01L 21/285
[52] U.S. Cl. .................. 437/192; 437/245; 437/187; 437/189; 427/124; 427/255.1
[58] Field of Search ............ 437/192, 245, 246, 187, 437/189; 427/99, 124, 255.1, 576, 595, 597

[56] References Cited

U.S. PATENT DOCUMENTS

| | | | |
|---|---|---|---|
| 4,495,221 | 1/1985 | Broadbent | 437/245 |
| 4,532,702 | 8/1985 | Gigante et al. | 437/187 |
| 4,617,087 | 10/1986 | Iyer et al. | 156/643 |
| 4,804,560 | 2/1989 | Shioya et al. | 427/125 |
| 4,849,260 | 7/1989 | Kusumoto et al. | 427/250 |
| 5,180,468 | 1/1993 | Ko et al. | 156/644 |
| 5,201,995 | 4/1993 | Reisman et al. | 156/646 |

FOREIGN PATENT DOCUMENTS 63-65075 3/1988 Japan .
63-65075 3/1988 Japan .
4-64223 2/1992 Japan .

OTHER PUBLICATIONS

Creighton, J. R., "A Mechanism for Selectivity Loss During Tungsten CVBD", J. Electro Chem. Soc., vol. 136, No. 1, Jan. 1989, pp. 271-275.

Primary Examiner—T. N. Quach
Attorney, Agent, or Firm—Pollock, Vande Sande & Priddy

[57] ABSTRACT

When a thin metal film is formed on a substrate at a constant substrate temperature by chemical vapor deposition while alternately and discontinuously introducing a raw material gas and a reducing gas onto the substrate, reducing the raw material gas with the reducing gas on the substrate, thereby conducting chemical vapor deposition, and repeating the chemical vapor deposition to obtain a desired film thickness, a thin metal film having a good surface flatness without any current leakage can be obtained without etching the substrate wafer, and when the reducing gas is excited to excited species by an exciting means at the introduction of the reducing gas and the excited species is used be reduce the raw material gas, a lower substrate temperature can be used and chemical vapor deposition process time can be made shorter than without using the exciting means.

8 Claims, 6 Drawing Sheets

PROCESS FOR FORMING A THIN METAL FILM BY CHEMICAL VAPOR DEPOSITION

BACKGROUND OF THE INVENTION

1) Field of the Invention

The present invention relates to a process for forming a thin metal film on a substrate by chemical vapor deposition in the production of semiconductor devices.

2) Prior Art

With higher integration of semiconductor devices the sizes of contact holes or throughholes formed in an insulating film on a substrate have been made extremely finer and finer. It is known that chemical vapor deposition (which will be hereinafter referred to as CVD) is an effective technique of filling or covering a high melting point metal etc. into recesses in a finer pattern, such as contact holes or throughholes in an insulating film on a substrate. In the conventional CVD deposition to form a thin metal film on a substrate by filling or covering the recesses, metal fluorides, for example, fluorides of tungsten, molybdenum, etc. are used as a raw material gas, and are introduced into a CVD chamber as a gas mixture with a reducing gas serving as a reducing agent such as hydrogen ($H_2$) gas or a silane ($SiH_4$) gas, thereby forming a thin metal film thereon.

However, the formation of a thin metal film on a substrate by CVD substantially depends on selected raw material gas and reducing gas and an etching reaction of a substrate wafer or deposited thin metal film takes place, depending on a reaction process of the selected raw material gas and reducing gas. For example, in the formation of a thin tungsten film on a substrate, reduction reaction to reduce tungsten hexafluoride to a metallic tungsten by hydrogen or silanes is most frequently used to form the metallic tungsten as ultimate products of the reactions. Thus, when a hydrogen gas is used as a reducing gas, the necessary reaction temperature is 400° to 500° C., at which etching reaction of silicon wafer is promoted, or the surface of the deposited thin metal film is roughened. When silanes are used as reducing gases, silicon is highly liable to retain in the deposited metal film, deteriorating the quility of the thin metal film, though the reduction reaction can proceed at a lower temperature. That is, when a hydrogen gas is used as a reducing gas, a high reduction temperature (high substrate temperature) is required for the reaction, resulting in roughening of the deposited thin metal film or etching of substrate wafer, which leads to current leakage or peeling of the thin metal film. When silanes are used as reducing gases, the deposited thin metal film is contaminated with silicon, resulting in higher resistivity and residual strain of the deposited thin metal film.

SUMMARY OF THE INVENTION

An object of the present invention is to provide a process for forming a thin metal film with low resistivity and residual strain on a substrate by CVD without any contamination of impurities such as silicon while preventing etching of substrate wafer, thereby suppressing current leakage and improving the film surface flatness.

According to the present invention, there is provided a process for forming a thin metal film on a semiconductor substrate by chemical vapor deposition, which comprises introducing a raw material gas and a reducing gas alternately and discontinuously onto a substrate, reducing the raw material gas adsorbed on the substrate with the reducing gas successively introduced thereon, thereby forming a thin metal film thereon, and repeating the introduction and reduction at a constant substrate temperature, thereby forming the thin metal film having a desired thickness thereon.

In this case, the reduction reaction takes place on and through the adsorbed raw material gas, so the substrate temperature can be lowered, as compared with vapor phase reduction reactions.

In the present invention, the reducing gas can be excited by an appropriate exciting means when the reducing gas is introduced onto the substrate, and the resulting excited species such an hydrogen radicals, etc. can be introduced onto the substrate. In that case, the substrate temperature can be further lowered and the thin metal film can be formed on the substrate within a shorter period of time. For example, when a hydrogen gas as a reducing gas is excited by plasma formed, for example, by electronic cyclotron resonance or by an ultraviolet ray and the excited hydrogen species, i.e. hydrogen radicals, is introduced onto the raw material gas, such as tungsten hexafluoride, adsorbed on the substrate surface, thereby reducing the adsorbed tungsten hexafluoride to a metal, such as tungsten, in a thin metal film form. In that case, the substrate temperature gives an influence only on the adsorption state of a raw material gas and not on the reduction reaction itself. Thus, the substrate temperature can be made lower with the excitation of a reducing gas than without the excitation, thereby much more improving the prevention of etching of substrate wafer and roughening of the film surface by the raw material gas.

The substrate for use in the present invention includes a substrate for producing a semiconductor device, particularly a wafer provided with an insulating film on the surface, particularly with recesses such as contact holes or throughholes in the insulating film, where the recesses are to be filled or covered with a metal.

The raw material gas for use in the present invention includes, for example, one of metal halides, such as tungsten hexafluoride, titanium tetrachloride, and organometallic compounds such as trimethyl aluminum and triethyl aluminum, and the reducing gas for use in the present invention is one of gases capable of reducing the raw material gas, such as a hydrogen gas, a hydrozine gas, a phosphine gas and diborane gas. In the present invention silanes are not used because they cause to contaminate the resulting thin metal film by silicon.

The substrate temperature (reduction or CVD process temperature) is a constant temperature selected from the conventional substrate temperature range so far used for CVD process, i.e. 400° to 500° C., throughout the entire CVD process when no exciting means for a reducing gas is used. When such an exciting means is used, a substrate temperature is a constant temperature selected from a range of room temperature to less than 400° C. In the present invention, CVD process is carried out at a constant substrate temperature selected from the above-mentioned ranges throughout the CVD process without conducting heat cycles of heating or cooling the substrate to change the substrate temperature. Thus, the CVD process time can be shortened. When the exciting means for the reducing gas is used, the CVD process time can be made much shorter than when no such means is used.

In the present invention, since the raw material gas and the reducing gas are introduced alternately and discontinuously, the etching of substrate wafer or roughening of the resulting thin metal film by the raw material gas can be prevented, and since no silane, compound is used as a reducing gas, there is low contamination of the resulting thin metal film with impurities such as silicon, and thus a thin metal film with low resistivity and less residual stress can be obtained by CVD.

REFERRED EMBODIMENTS OF THE INVENTION

EXAMPLE 1

Figure 1:
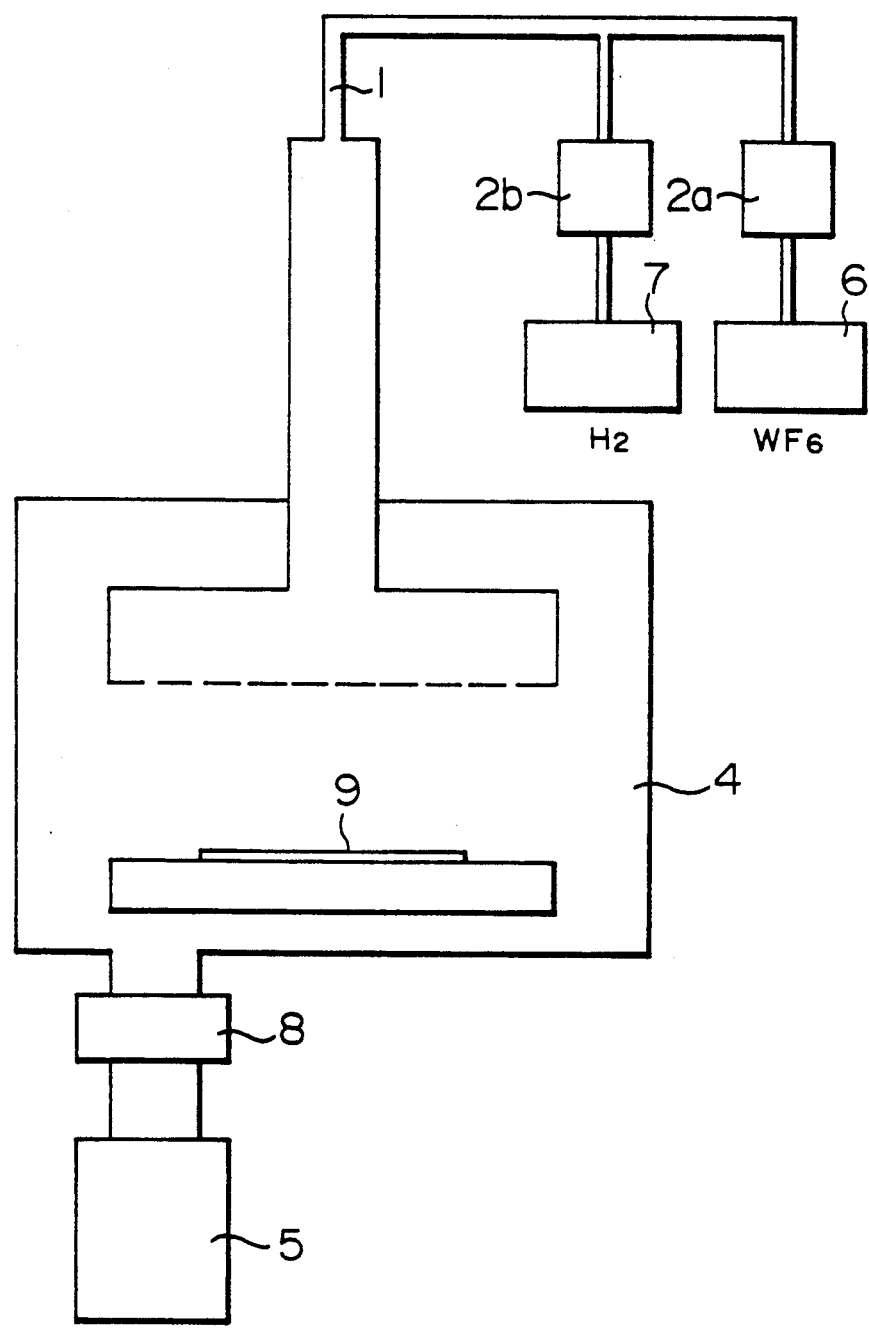
FIG. 1 schematically shows a CVD apparatus used in Example 1 of the present invention.
Figure 2:
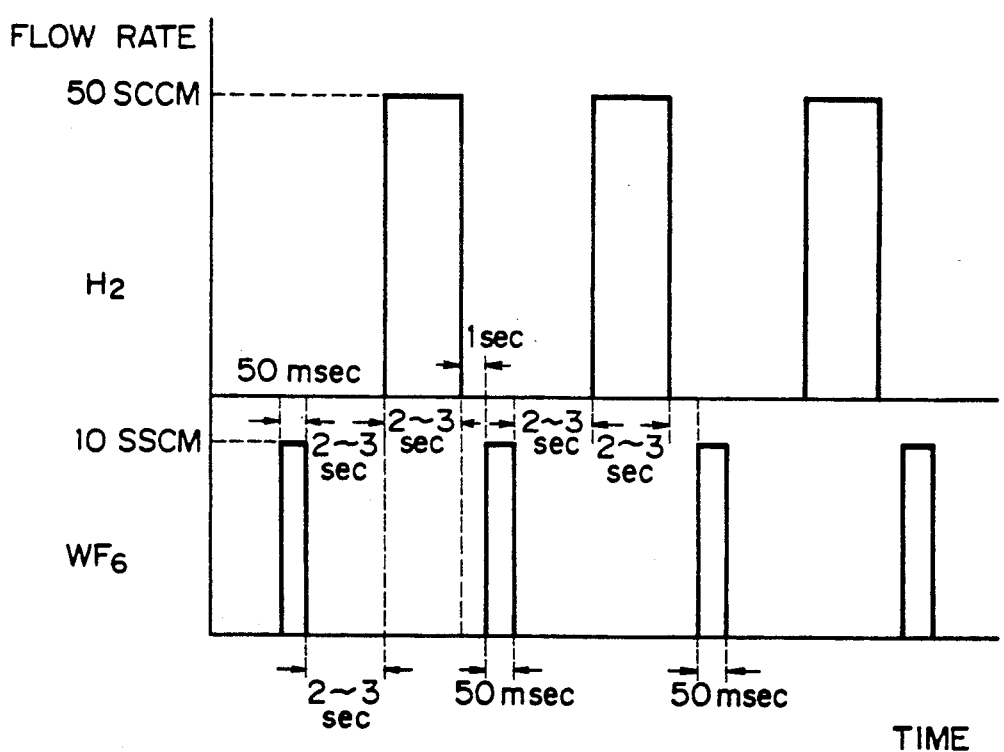
FIG. 2 shows a time sequence, together with gas flow rates, of introducing a raw material gas ($WF_6$) and a reducing gas ($H_2$) alternately and discontinuously in Example 1 of the present invention.

A tungsten hexafluoride ($WF_6$) gas as a raw material gas and a hydrogen ($H_2$) gas were alternately and discontinuously introduced onto a semiconductor device substrate in a CVD apparatus shown in FIG. 1 with a time sequence and gas flow rates shown in FIG. 2 to form a thin tungsten metal film on the substrate.

Figure 3A:
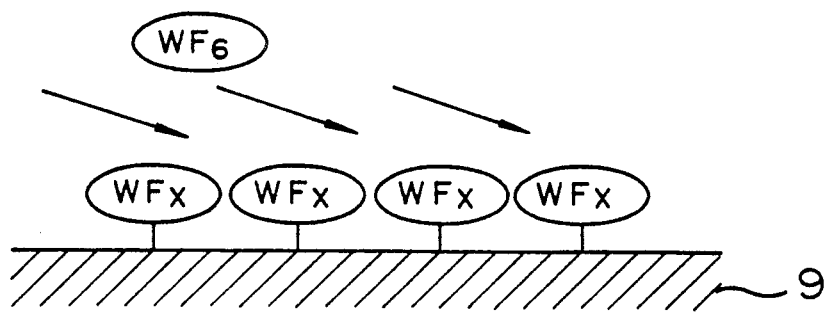
FIGS. 3A to 3C schematically show steps of forming a thin tungsten film in Example 1 of the present invention.
Figure 3B:
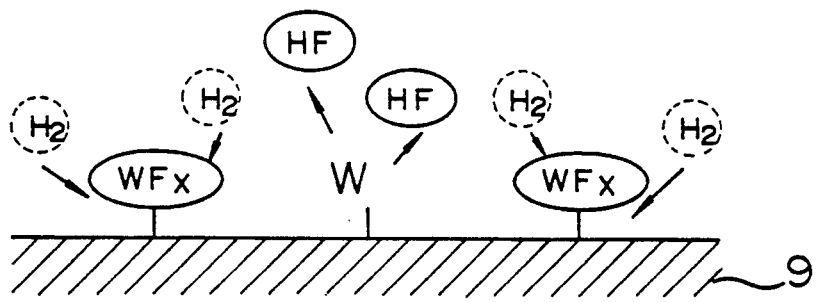
Figure 3C:
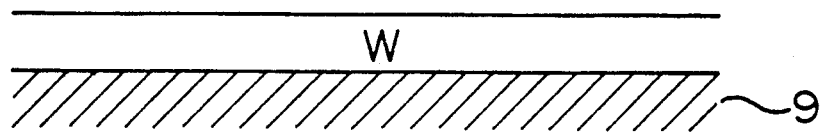

That is, a CVD chamber 4 was evacuated to a desired vacuum, which was typically several tens Torr, by a vacuum pump 5 through a pressure controller 8, and then a tungsten hexafluoride ($WF_6$) gas as a raw material gas 6 was introduced into the CVD chamber 4 through a gas flow rate controller 2a, as shown in FIG. 3A. At that time, the CVD chember 4 and the semiconductor device substrate 9 were kept constantly at 400° C. by heating. The introduced raw material gas ($WF_6$) was adsorbed on the surface of the semiconductor device substrate 9 to a thickness of 3 to 5 molecules (WFx), and supply of the raw material gas was discontinued, as shown in FIG. 3B, and then a hydrogen ($H_2$) gas as a reducing gas 7 was introduced into the CVD chamber 4 through a gas flow rate controller 2b. The raw material (WFx) adsorbed on the substrate was reduced by the $H_2$ gas to metallic tungsten (W), thereby depositing a thin tungsten film on the substrate 9, as shown in FIG. 3C. Then, supply of the raw material gas and the reducing gas was alternately and discontinuously repeated with the same time sequence and gas flows rates as shown in FIG. 2 to form a thin W film having a desired thickness on the substrte 9.

Substrate temperature and physical properties of the thin tungsten metal film formed on the semiconductor device substrate by CVD according to the present invention and those of the thin tungsten metal films formed on the same substrates by conventinal CVD processes using a mixture of tungsten hexafluoride gas and hydrogen gas and a mixture of tungsten hexafluoride gas and silane ($SiH_4$) gas as a reducing gas, respectively, are shown in the following Table.

TABLE

| | $WF_6 + H_2$ mixed gas | $WF_6 + SiH_4$ mixed gas | The Invention |
|---|---|---|---|
| Substrate temperature | 500° C. | 350° C. | 400° C. |
| Resistivity | 8-10 μΩcm | 30-40 μΩcm | 8-10 μΩcm |
| Recess coverage | >95% | 50-60% | ~100% |
| Surface roughness | Δ | ○ | ⊙ |
| EM resistance | More than 100 MA/cm² | More than 100 MA/cm² | More than 100 MA/cm² |

In the above table, the recess coverage means a ratio thickness a of film formed on the plane surface to thickness b of film formed on the bottom (underlayer surface) of recess such as contract hole or throughhone, i.e. b/a×100%, where a value nearer 100% is better. The surface roughness is evaluated by a surface reflectance, where double circle mark means ⊙ that the surface state is substantially a mirror surface and is excellent, single circle mark ○ means that the surface state is nearly a mirror state and is satisfactory, and triangle mark Δ means that the surface state is far from the mirror surface and is poor.

From the foregoing Table it can be seen that a thin tungsten, metal film with a good surface flatness without any etching of the substrate could be obtained by repeating alternate and discontinuous supply of the raw material $WF_6$ gas and a reducing $H_2$ gas according to the present invention

EXAMPLE 2

A thin tungsten metal film was formed on a semiconductor device substrate by introducing a raw material $WF_6$ gas and a reducing $H_2$ gas alternately and discontinuously onto the substrate in a CVD apparatus provided with an RF induced plasma generator as an exciting means with the similar time sequence and gas flow rates to those of FIG. 2. That is, a discharge pipe 3 and a CVD chamber 4 were evacuated to a desired vacuum, which was typically several tens Torr, by a vacuum pump 6 through a pressure controller 8, and then a tungsten hexafluoride ($WF_6$) gas as a raw material gas 6 was introduced into the discharge pipe 3 through a gas flow rate controller 2a.

At that time, the CVD chamber 4 and the semiconductor device substrate 9 were kept constantly at 300° C. or less by heating. The introduced raw material gas ($WF_6$) was adsorbed on the surface of the semiconductor device substrate 9 to a thickness of 3 to 5 molecules (WFx), and supply of the raw material gas was discontinued, and then a hydrogen ($H_2$) gas as a reducing gas 7 was indroduced into the discharge pipe 3 through a gas flow rate controller 2b. A plasma was generated in the discharge pipe 3 by applying a radiofrequency wave thereto from an RF wave oscillator 10 to excite the reducing $H_2$ gas into excited hydrogen species. The raw materal (WFx) adsorbed on the substrate 9 was reduced by the excited hydrogen species, i.e. hydrogen radicals, to metallic tungsten (W), thereby depositing a thin tungsten metal film on the substrate 9. Then, supply of the raw material gas and the reducing gas was alternately and discontinuously repeated with the similar time sequence and gas flows rates to those shown in FIG. 2 to form a thin W film having a desired thickness on the substrate 9.

An argon gas, etc. could be added to the discharge pipe 3 to stabilize the electric discharge.

A thin tungsten metal film having the similar physical properties to those of Example 1 could be obtained by the CVD process of Example 2.

By using an RF induced plasma generator as an exciting means for the reducing gas, a lower substrate temperature could be used and the CVD process time could be made shorter than without using the exciting means.

EXAMPLE 3

A thin tungsten metal film was formed on a semiconductor device substrate 9 by CVD in a CVD apparatus using an electronic cyclotron resonance as an exciting means for a reducing gas in the same manner in Example 2. That is, a thin tungsten metal film having the similar physical properties to those of Example 1 was obtained by alternately and discontinuously introducing a raw material $WF_6$ gas 6 and a reducing $H_2$ gas 7 into a CVD chamber 4 through an electronic resonance discharge pipe 14 comprising a microwave oscillator 13 and an electromagnet 12 in place of the RF induced discharge pipe of Example 2 in the same manner as in Example 2 with the similar time requence and gas flow rates to those of FIG. 2, while exciting the reducing $H_2$ gas into excited hydrogen species by the electronic cyclotron resonance discharge. In this case, an argon gas, etc. could be added to the discharge pipe 14 to stabilize the electric discharge.

By using an electronic cyclotron resonance as an exciting means for the reducing gas, a lower substrate temperature could be used and the CVD process time could be made shorter than without using the exciting means.

EXAMPLE 4

A thin tungsten metal film was formed on a semiconductor device substrate 9 by CVD in a CVD apparatus using photo excitation by ultraviolet ray as an exciting means for a reducing gas in the same manner as in Example 2. That is, a thin tungsten metal film having the similar plrysical properties to those of Example 1 was obtained by alternately and discontinuously introducing a raw material $WF_6$ gas 6 and a reducing $H_2$ gas 7 into a CVD chamber 4 with an ultraviolet lamp 15 provided over the semiconductor device substrate 9 in place of the RF induced discharge pipe of Example 2 in the same manner as in Example 2 with the similar time sequence and gas flow rates to those of FIG. 2, while exciting the reducing $H_2$ gas into excited hydrogen species by ultraviolet ray.

By using an ultraviolet lamp as an exciting means for the reducing gas, a lower substrate temperature could be used and the CVD process time could be made shorter than without using the exciting means.

As an ultraviolet source, an ultraviolet laser such as excimer laser, etc. or a vacuum ultraviolet source such as hydrogen discharge, etc. can be also used.

Figure 4:
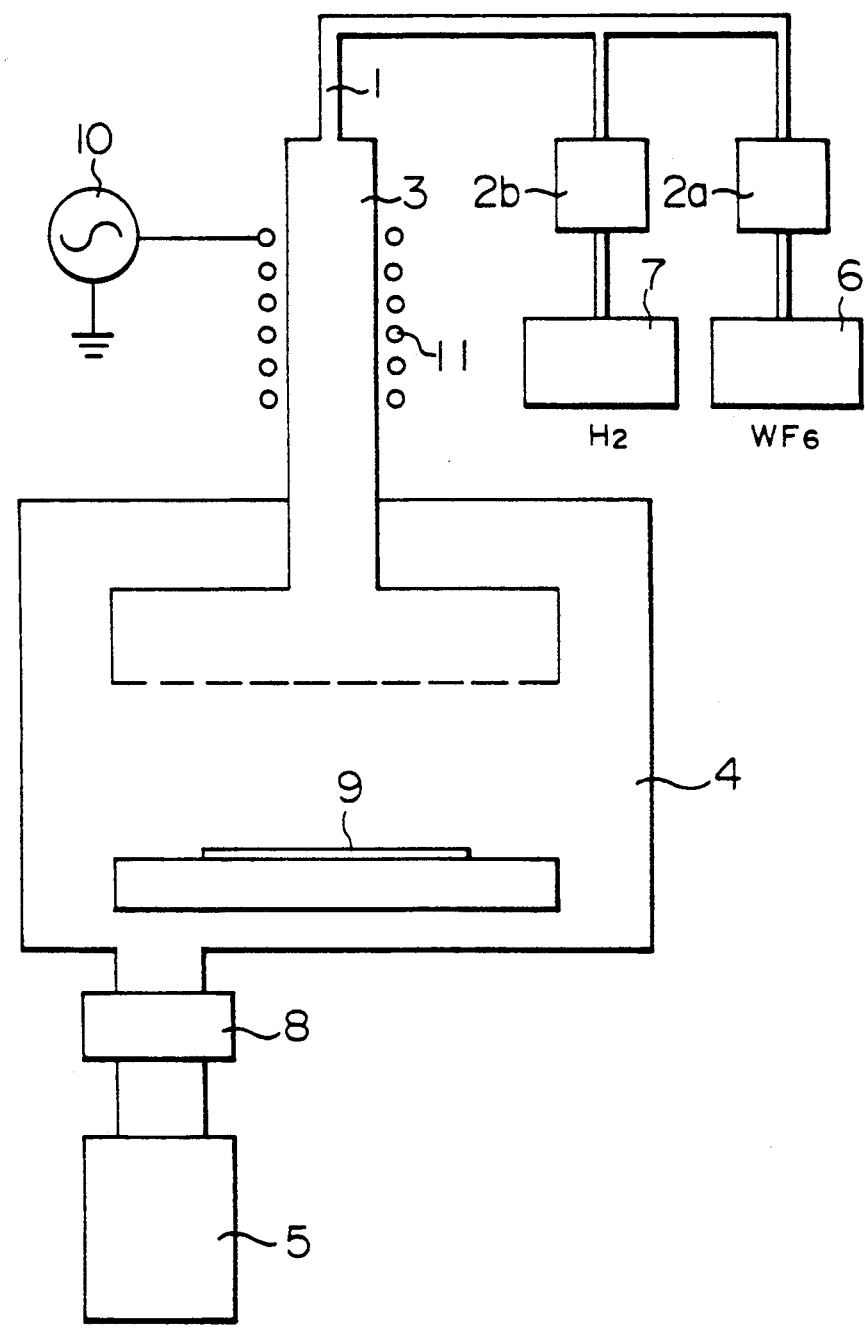
FIG. 4 schematically shows another CVD apparatus used in Example 2 of the present invention.
Figure 5:
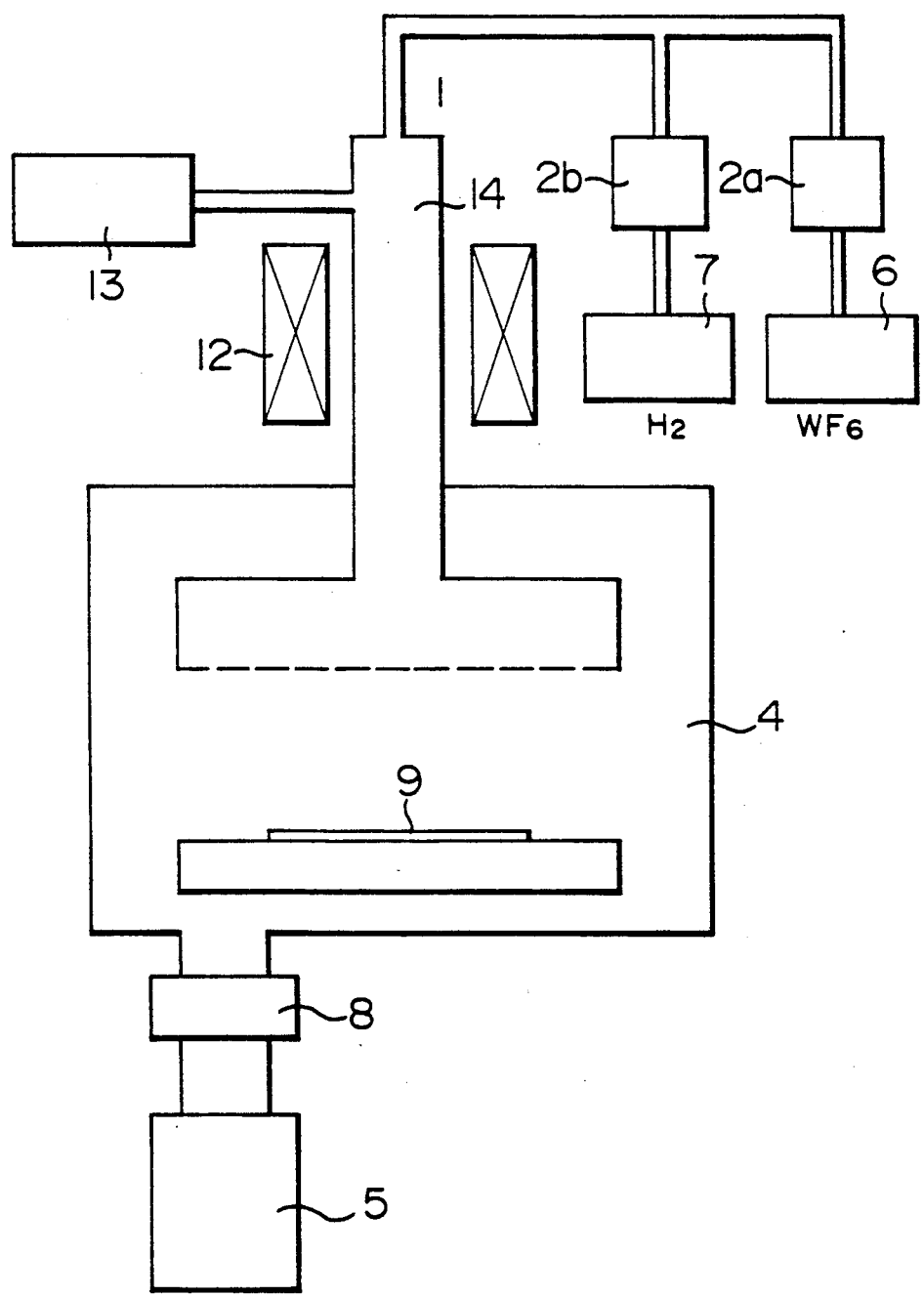
FIG. 5 schematically shows other CVD apparatus used in Example 3 of the present invention.
Figure 6:
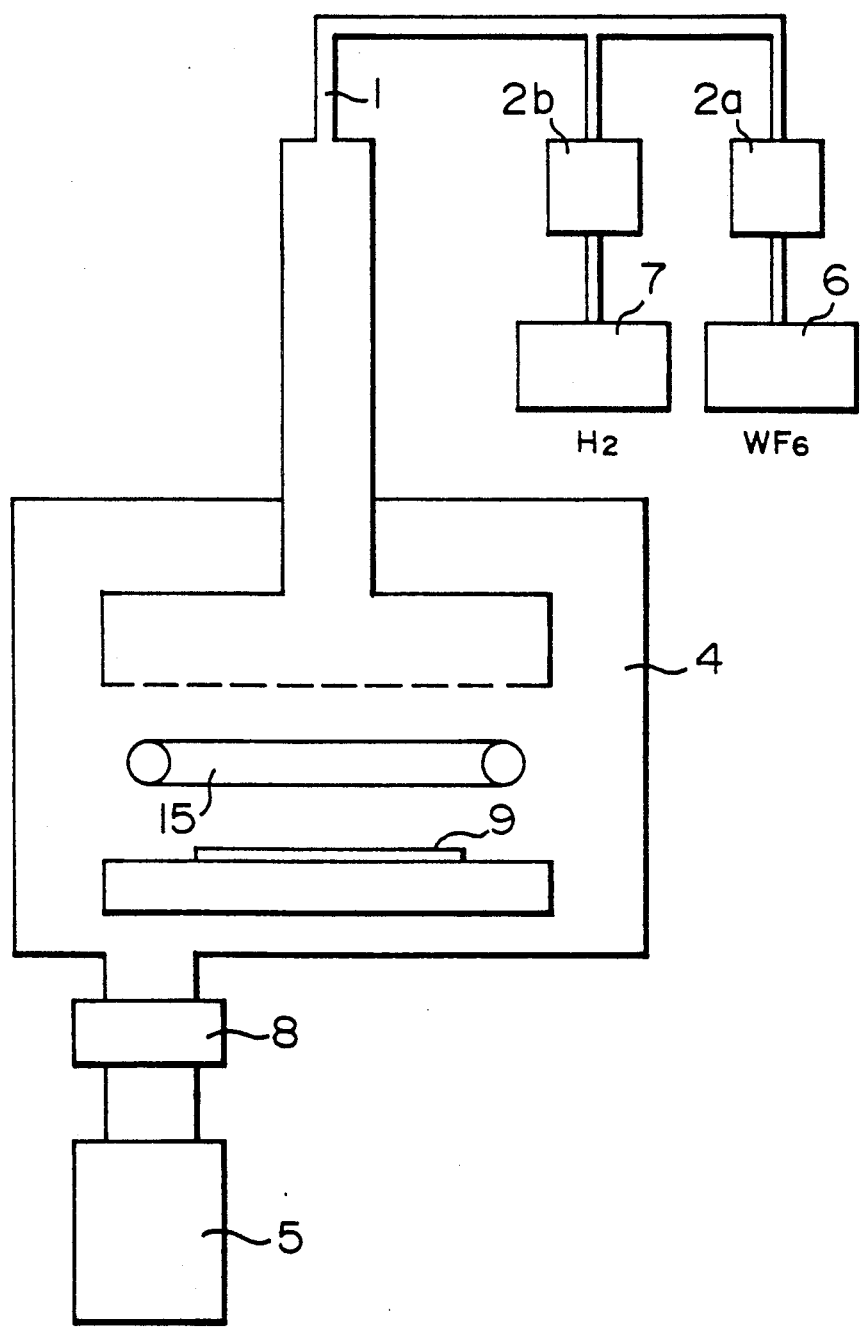
FIG. 6 schematically shows a further CVD apparatus used in Example 4 of the present invention.

It is possible to combine the embodiment of FIG. 6 with that of FIG. 4 or FIG. 5.

As explained above, the present invention provides a process for producing a thin metal film having a good surface flatness on a substrate by CVD by decomposing a raw material gas with a reducing gas without etching of substrate wafer and roughening of the film surface, while alternately and discontinuously introducing the raw material gas and the reducing gas onto the substrate.

Furthermore, when the reducing gas is excited to excited species by an exciting means at the introduction of the reducing gas, and the resulting excited species is used to decompose the raw material gas adsorbed on the substrate, a lower substrate temperature can be used and the CVD process time can be made shorter than without such excitation.

What is claimed is:

1. A process for forming a thin metal film on a substrate by chemical vapor deposition, which comprises alternately and discontinuously introducing a raw material gas and a reducing gas onto a substrate, reducing the raw material gas with the reducing gas on the substrate at a constant substrate temperature, thereby conducting chemical vapor deposition on the substrate, and repeating the chemical vapor deposition, thereby forming a thin metal film having a desired thickness on the substrate.

2. A process according to claim 1, wherein the raw material gas is one of metal halides and organometallic compounds, and the reducing gas is one of gases capable of decomposing the raw material gas to its constituent metal.

3. A process according to claim 1, wherein the raw material gas is a tungsten hexafluoride gas and the reducing gas is a hydrogen gas.

4. A process according to claim 1, wherein the chemical vapor deposition is carried out at a constant substrate temperature of 400° to 500° C. in a reduced pressure.

5. A process according to claim 1, wherein the reducing gas is excited into its excited species by an exciting means at the introduction of the reducing gas, and the raw material gas is reduced by the excited species.

6. A process according to claim 5, wherein the exciting means is RF-induced plasma, electronic cyclotron resonance or ultraviolet ray.

7. A process according to claim 6, wherein the chemical vapor deposition is carried out at a constant substrate temperature of room temperature to less than 400° C.

8. A process according to claim 1, wherein the substrate is a semiconductor device substrate.

* * * * *